US010706894B1

(12) United States Patent
Chang et al.

(10) Patent No.: US 10,706,894 B1
(45) Date of Patent: Jul. 7, 2020

(54) DATA STORAGE DEVICE FOR SERVER

(71) Applicant: Super Micro Computer Inc., San Jose, CA (US)

(72) Inventors: Hung-Chieh Chang, San Jose, CA (US); Yueh-Ming Liu, San Jose, CA (US); Tan-Hsin Chang, San Jose, CA (US); Kuan-Ming Lin, San Jose, CA (US); Hsiao-Chung Chen, San Jose, CA (US); Chih-Wei Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 16/243,853

(22) Filed: Jan. 9, 2019

(51) Int. Cl.
*H05K 7/00* (2006.01)
*G11B 33/12* (2006.01)
*H05K 5/02* (2006.01)
*H05K 7/14* (2006.01)

(52) U.S. Cl.
CPC ........... *G11B 33/123* (2013.01); *H05K 5/023* (2013.01); *H05K 5/0247* (2013.01); *H05K 7/1487* (2013.01)

(58) Field of Classification Search
None
See application file for complete search history.

(56) References Cited

U.S. PATENT DOCUMENTS

| 5,214,768 A * | 5/1993 | Martin | G06F 3/0601 711/114 |
| 5,340,340 A * | 8/1994 | Hastings | G06F 1/181 312/223.1 |
| 5,604,662 A * | 2/1997 | Anderson | G06F 1/184 312/204 |
| 5,726,922 A * | 3/1998 | Womble | G06F 1/184 361/726 |
| 6,016,252 A * | 1/2000 | Pignolet | G06F 1/18 312/223.2 |
| 6,023,148 A * | 2/2000 | Pignolet | G06F 1/188 320/119 |
| 6,078,503 A * | 6/2000 | Gallagher | G06F 1/16 108/61 |
| 7,344,394 B1 * | 3/2008 | Barina | G06F 1/183 361/755 |
| 8,416,563 B2 * | 4/2013 | Hou | H05K 7/1489 211/26 |
| 8,807,488 B2 * | 8/2014 | Lee | G06F 1/187 248/222.51 |

(Continued)

*Primary Examiner* — Jinhee J Lee
*Assistant Examiner* — Rashen E Morrison
(74) *Attorney, Agent, or Firm* — Chun-Ming Shih; HDLS IPR Services

(57) ABSTRACT

A data storage device includes a tray, a circuit board module and two storage units. The tray has a carrying space. The circuit board module includes a circuit board, a pair of adapter slots and a connection slot. The pair of adapter slots are disposed with an interval at one side of the tray, and the storage units are arranged side by side in the carrying space. Each storage unit includes a carrying box and a storage component. The carrying box is pivoted with a handle, and two sides of the handle are pivoted at opposite sides of the carrying box so that the handle is capable of rotating above the carrying box. The storage component is inserted in the adapter slot to electrically connect with the circuit board.

20 Claims, 6 Drawing Sheets

(56) References Cited

U.S. PATENT DOCUMENTS

| | | | |
|---|---|---|---|
| 9,030,819 B2* | 5/2015 | He | G11B 33/124 |
| | | | 248/222.51 |
| 9,230,606 B2* | 1/2016 | Ding | G11B 33/124 |
| 9,686,883 B2* | 6/2017 | Butterbaugh | H05K 7/1409 |
| 9,959,909 B1* | 5/2018 | Chang | G06F 1/187 |
| 10,317,949 B1* | 6/2019 | Lin | H05K 7/1487 |
| 2004/0177219 A1* | 9/2004 | Meehan | G06F 1/187 |
| | | | 711/114 |
| 2011/0148869 A1* | 6/2011 | Choi | H04N 5/64 |
| | | | 345/419 |
| 2012/0243170 A1* | 9/2012 | Frink | G06F 1/187 |
| | | | 361/679.34 |
| 2016/0215926 A1* | 7/2016 | Pollex | F16M 11/041 |

* cited by examiner

DATA STORAGE DEVICE FOR SERVER

BACKGROUND OF THE INVENTION

Field of the Invention

The present invention generally relates to data storage device and, in particular to data storage device for sever.

Description of Prior Art

In order to meet acquirements of access a large amount of electronic data, a plurality of docking spaces is provided inside cabinets of the server system for accommodating storage devices disposed in an array. The most common type of storage devices includes Hard Disk Drives (HDDs) or Solid State Disks (SSDs) etc. Generally, sizes of a hard disk drive or a solid state disk are 2.5 inches and 3.5 inches. Therefore, the sizes of the trays for carrying hard disks are set according to actual hard disk sizes.

Moreover, since server industries usually need to change designs of chasses and trays according to different requirements of users, such as docking spaces, quantities and sizes of the trays, etc., thus the development schedule of the server system will be very long and the cost is greatly increased.

In view of the above drawbacks, the Inventor proposes the present invention based on his expert knowledge and elaborate researches in order to solve the problems of prior art.

SUMMARY OF THE INVENTION

Accordingly, an object of the present invention is to provide a data storage device for server to achieve the purpose of disposing a plurality of storage units on the tray.

In order to achieve the object mentioned above, the present invention provides a data storage device for server including a tray, a circuit board module and two storage units. The tray has a carrying space. The circuit board module includes a circuit board, a pair of adapter slots and a connection slot. The pair of adapter slots are disposed with an interval at one side of the tray, and the storage units are arranged side by side in the carrying space. Each storage unit includes a carrying box and a storage component. The carrying box is pivoted with a handle, and two sides of the handle are pivoted at opposite sides of the carrying box so that the handle is capable of rotating above the carrying box. The storage component is inserted in the adapter slot to electrically connect with the circuit board.

Comparing to the prior art, the circuit board module of the present invention includes a circuit board, a pair of adapter slots and a connection slot. The pair of adapter slots are disposed with an interval at one side of the tray, and the connection slot is located at another side of the circuit board and disposed in a direction perpendicular to the pair of adapter slots. Moreover, the carrying box is pivoted with a handle which is capable of rotating above the carrying box; besides, the storage units are inserted in the adapter slot to electrically connect with the circuit board. Thereby, two storage units can be arranged side by side in the carrying space, and the purpose of arranging a plurality of storage units on the tray will be achieved for enhancing the practice of the present invention.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
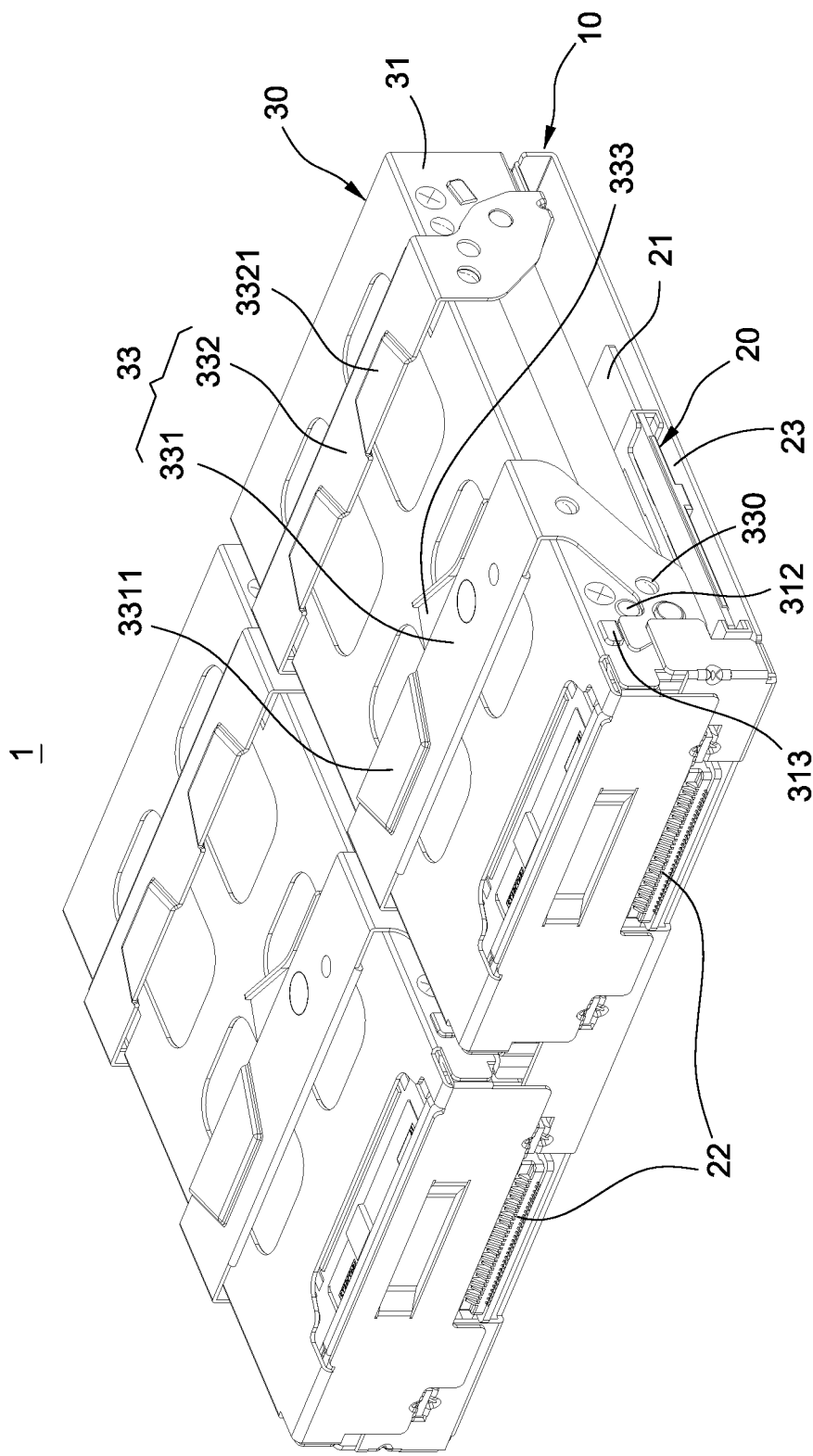
FIG. 1 is a perspective schematic view of data storage device for server of the present invention.
Figure 2:
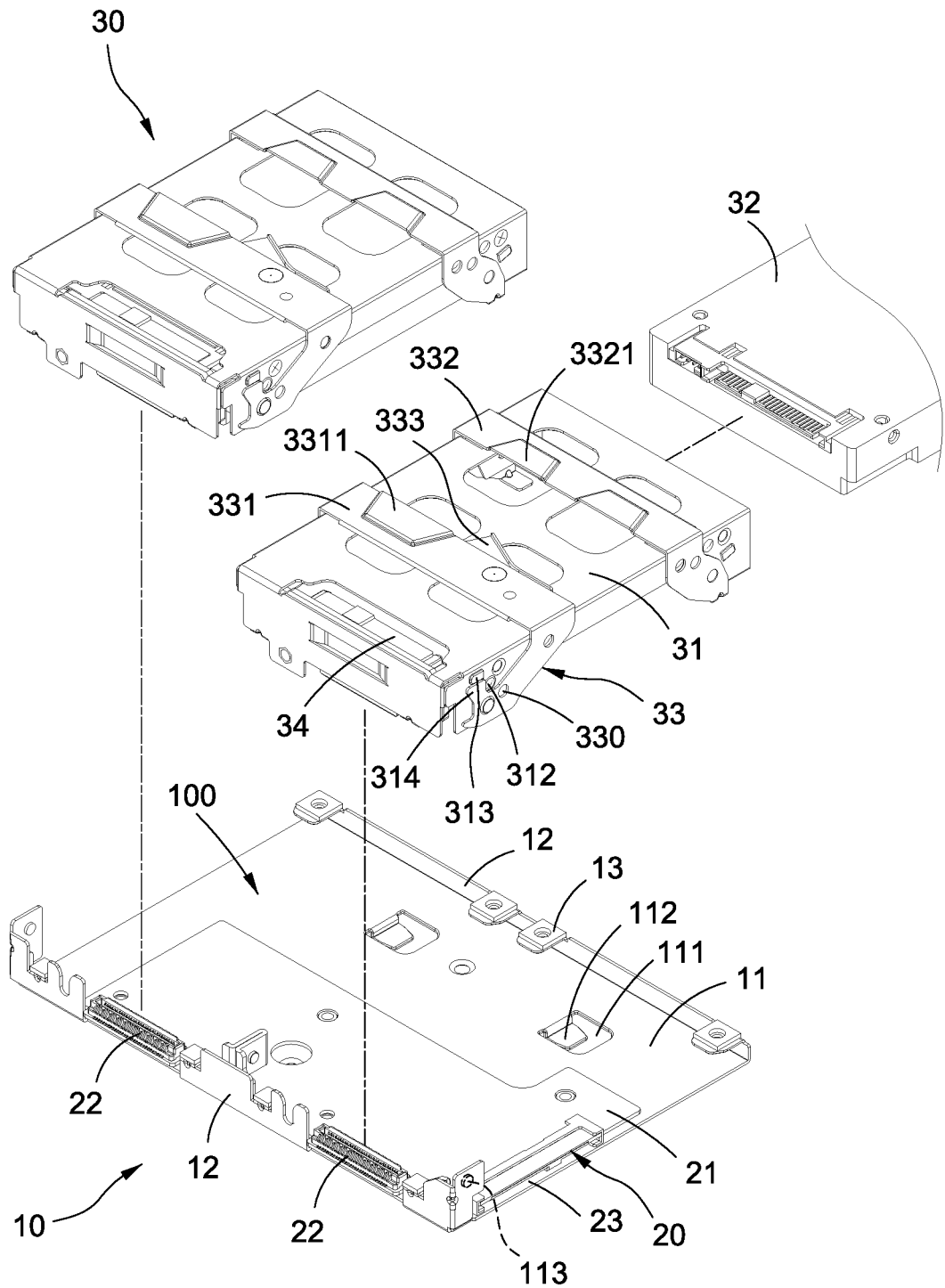
FIG. 2 is a perspective explosion schematic view of data storage device for server of the present invention.
Figure 3:
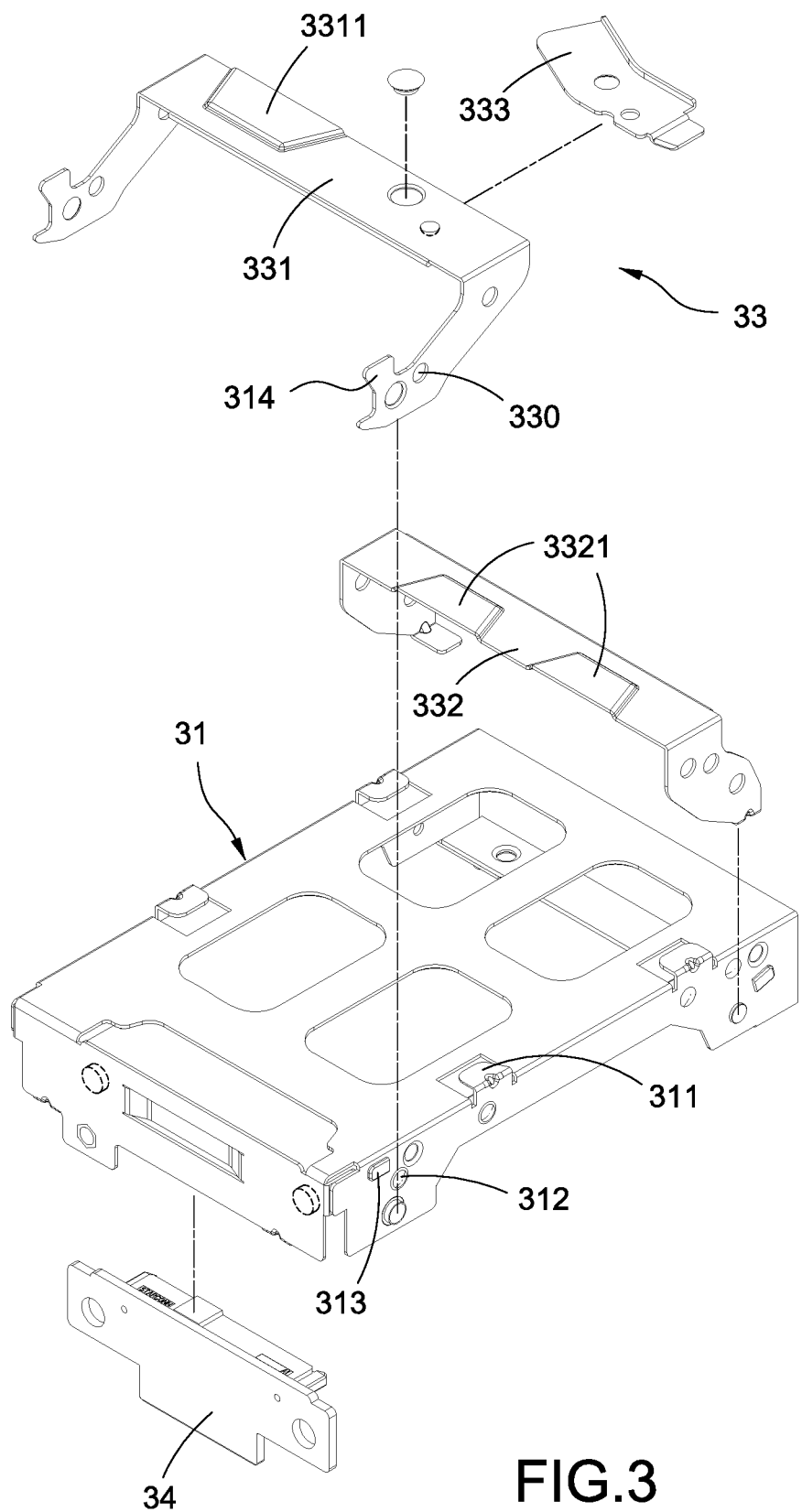
FIG. 3 is an explosion schematic view of the storage unit of the present invention.

Please refer to FIG. 1 to FIG. 3, which depict a perspective schematic view of data storage device for server of the present invention, a perspective explosion schematic view of data storage device for server of the present invention, and an explosion schematic view of the storage unit of the present invention. The present invention is a data storage device 1 for server including a tray 10, a circuit board module 20 and two storage units 30. The circuit board module 20 is combined on the tray 10, and the two storage units 30 are disposed on the tray 10 and are electrically connected with the circuit board module 20. More detail descriptions of the data storage device 1 are as follows.

The tray 10 has a carrying space 100, and the circuit board module 20 is disposed in the carrying space 100. The circuit board module 20 includes a circuit board 21, a pair of adapter slots 22 and a connection slot 23. The pair of adapter slots 23 are disposed with an interval at one side of the tray 10; preferably, the connection slot 23 is located at another side of the circuit board 21 and disposed in a direction perpendicular to the pair of adapter slots 22. In real practice, the connection slot 23 is provided for inserting another connector so as to electrically connect the connection slot 23 to the server.

Moreover, the two storage units are arranged side by side in the carrying space 100. Each storage unit 30 includes a carrying box 31 and a storage component 32 fixed in the carrying box 31. The carrying box 31 is pivoted with at least one handle 33, and two sides of the at least one handle 33 are respectively pivoted at opposite sides of the carrying box 31 so that the handle 33 is capable of rotating above the carrying box 31. Furthermore, the storage component 32 is inserted in the adapter slot 22 to electrically connect with the circuit board 21. In more detail, the storage unit 30 includes an adapter connector 34, and the storage component 32 is plugged into the adapter slot 22 through the adapter connector 34.

It is worthy of note that, in the present embodiment, the size of the tray 10 is provided for placing a 3.5-inch hard disk, and when two 2.5-inch hard disks (the storage unit of this embodiment) are replaced to place therein, they are laterally juxtaposed on the tray 10.

Moreover, in one embodiment of the present invention, the at least one handle 33 includes a first handle 331 and a second handle 332; the first handle and the second handle are rotated in opposite directions above the carrying box 31. Besides, the first handle 331 is located at a side of the carrying box 31 neighboring the pair of adapter slots 22. The first handle 331 is provided with a latch plate 333, and the carrying box 31 is provided with a lock plate 311. The first hand 331 can be rotated away from a top of the carrying box 31 through the latch plate 331 disengaging from a blocking of the lock plate 311. The operation of the latch piece 333 will be described in more detail later.

In addition, the first handle 331 and the second handle 332 are respectively provided with at least one bump region 3311, 3221 for applying an external force thereon. In the present embodiment, the second hand 332 is provided with two bump regions 3321 arranged at intervals.

In more detail, two sides of the carrying box 31 are respectively provided with two positioning blocks 312, and two sides of the at least one handle 33 are respectively provided with two positioning holes 330. The positioning block 312 is fastened in the positioning hole 330 after the at least one hand 33 rotating at a predetermined angle above the carrying box 31. To be more important, two sides of the carrying box 31 are respectively provided with a stop block 313, and one side of the at least one handle 33 is blocked at a side of the stop block 313 after the at least one hand 33 rotating at a predetermined angle above the carrying box 31.

Specifically, the tray 10 includes a bottom plate 11 and a plurality of supporting plate 12 vertically formed at a periphery of the bottom plate 11. The supporting plates 12 has formed a plurality of supporting pads 13, and the two storage units 30 are positioned on the supporting pads 13. Thus, the two storage units 30 are fixed on the supporting pads 13, and a distance is held between the two storage units 30 and the bottom plate 11 so that the two storage units 30 can have a good heat dissipation effect.

In the present embodiment, the bottom plate 11 of the tray 10 has formed a plurality of hollow parts 111 and a plurality of hooks 112 located correspondingly. Each hook 112 is bended from a side of the hollow portion 111 and extended in a way of away from the carrying space 100. Accordingly, the tray 10 can be fixed by the hooks 112 inserted in the slot of the cabinet (not shown).

Figure 4:
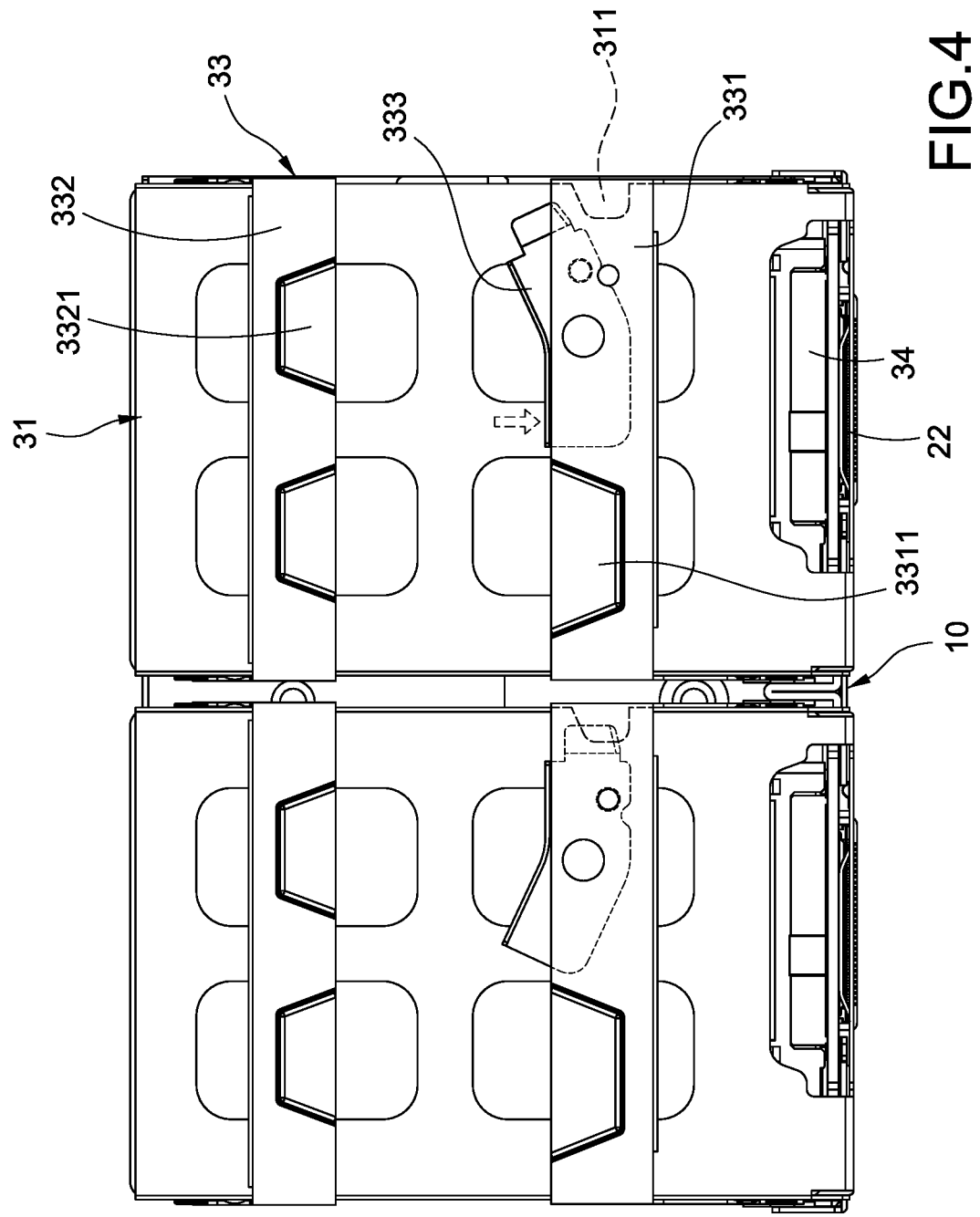
FIG. 4 is an operation schematic view of the latch piece of the present invention.
Figure 5:
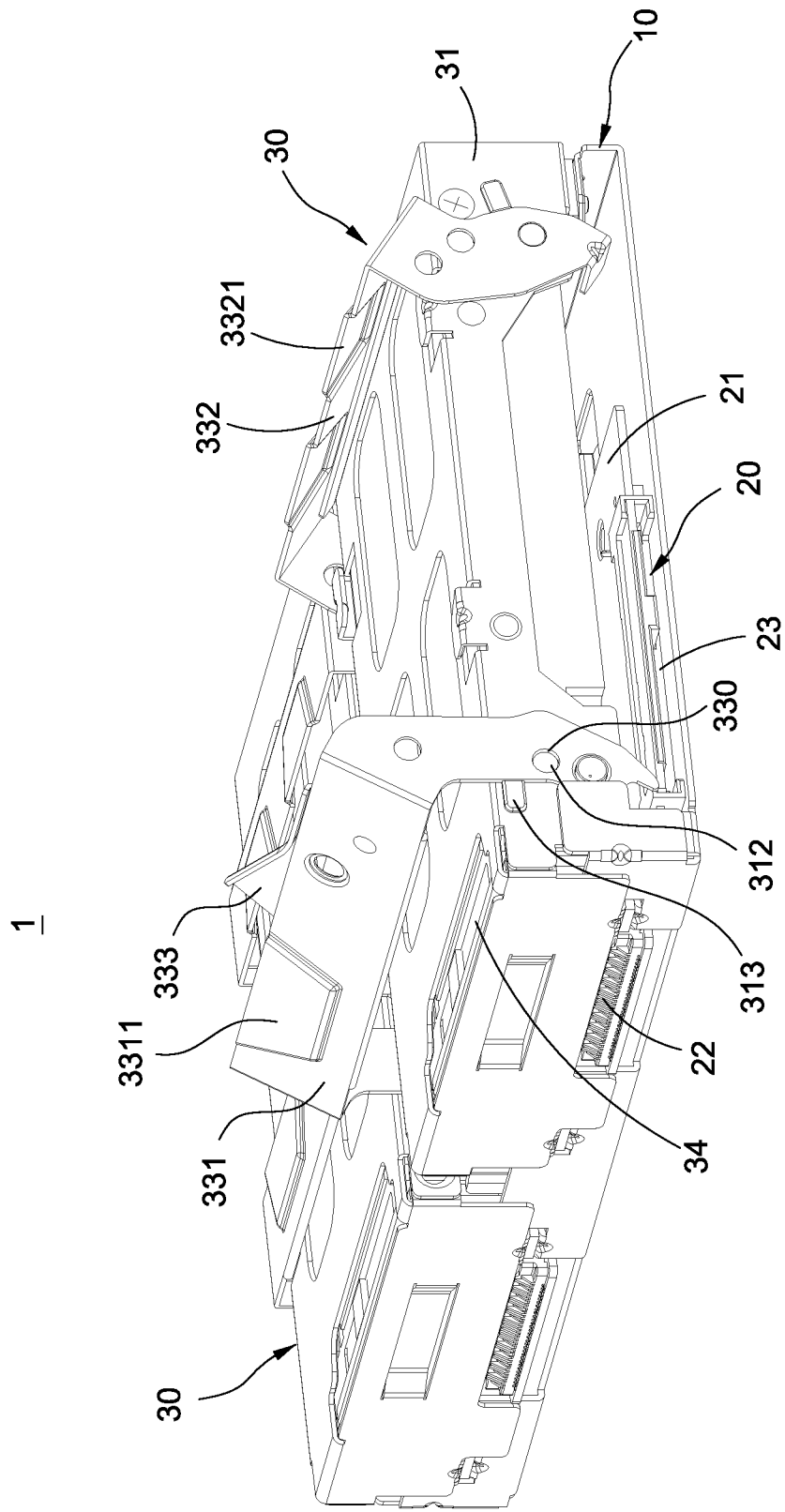
FIG. 5 is a rotating schematic view of the handle of the present invention.
Figure 6:
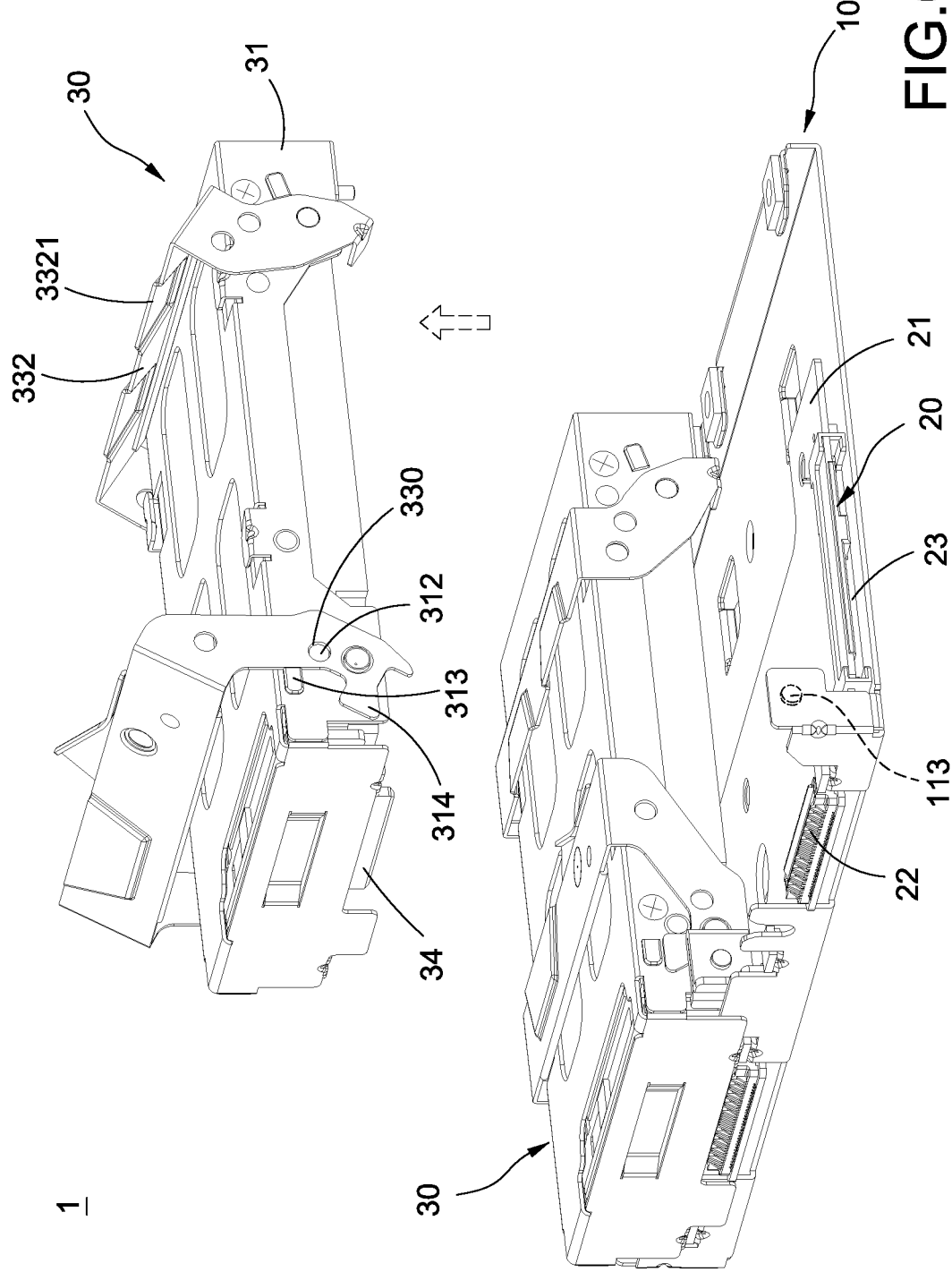
FIG. 6 is a detaching schematic view of the storage unit of the present invention.

With referring FIG. 4 to FIG. 6, which depict an operation schematic view of the latch piece, a rotating schematic view of the handle and a disengagement view of the storage unit of the present invention. As shown in FIG. 4, when the storage unit 30 of the present invention is to be detached from the tray 10, one side of the latch piece 333 is pushed firstly to be disengaged from the blocking of the latch piece 333. And then, the first handle 331 can be rotated above the carrying box 31.

As shown in FIG. 5, a user can put fingers into the bump area 3311 for facilitating the rotation of the first handle 331 at a predetermined angle above the carrying box 31. It is worth noting that the positioning block 312 is fastened in the positioning hole 330 now. Moreover, one side of the first handle 331 is abutted against the side of the stop block 313, and the second handle 332 on the other side is also positioned after rotating at a predetermined angle.

Please further refer to FIG. 6, when the first handle 331 and the second handle 332 are respectively positioned above the carrying box 31, users can hold the first handle 331 and the second handle 332 respectively for applying force. At this time, a push arm 314 located on one side of the first handle 331 is pushed down against a push block 113 on the bottom plate 11 correspondingly. The storage unit 30 will be separated from the adapter slot 22 under the reaction force of the external force that the push block 113 is pushed against. Accordingly, the storage unit 30 is vertically detached from the tray 10.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A data storage device for server, comprising:
a tray having a carrying space;
a circuit board module disposed in the carrying space and including a circuit board, a pair of adapter slots and a connection slot; the pair of adapter slots disposed with an interval at one side of the tray; and
two storage units arranged side by side in the carrying space; each storage unit including a carrying box and a storage component fixed in the carrying box; the carrying box pivoted with at least one handle, and two sides of the at least one handle pivoted at opposite sides of the carrying box so that the handle is capable of rotating above the carrying box, and the storage component inserted in the adapter slot to be electrically connected with the circuit board,
wherein the tray includes a bottom plate and a plurality of supporting plate formed vertically at a periphery of the bottom plate; the supporting plates are formed of a plurality of supporting pads, and the two storage units are positioned on the supporting pads.

2. The data storage device for server according to claim 1, wherein the bottom plate is formed a plurality of hollow parts and a plurality of hooks located correspondingly; each hook is bent and extended from a side of the hollow portion toward a direction away from the carrying space.

3. The data storage device for server according to claim 1, wherein the connection slot is disposed at a side of the circuit board in a direction perpendicular to the pair of adapter slots.

4. The data storage device for server according to claim 1, wherein there are a plurality of handles each including a first handle and a second handle; the first handle and the second handle are rotated in opposite directions above the carrying box.

5. The data storage device for server according to claim 4, wherein the first handle is located at a side of the carrying box neighboring the pair of adapter slots; the first handle is provided with a latch plate, and the carrying box has a lock plate; the first handle can be rotated away from a top of the carrying box through the latch plate disengaging from a blocking of the lock plate.

6. The data storage device for server according to claim 4, wherein the first handle and the second handle are respectively provided with at least one bump region for applying an external force thereon.

7. The data storage device for server according to claim 4, wherein the second handle is provided with two bump regions arranged at intervals.

8. A data storage device for server, comprising:
a tray having a carrying space;

a circuit board module disposed in the carrying space and including a circuit board, a pair of adapter slots and a connection slot; the pair of adapter slots disposed with an interval at one side of the tray; and two storage units arranged side by side in the carrying space; each storage unit including a carrying box and a storage component fixed in the carrying box; the carrying box pivoted with at least one handle, and two sides of the at least one handle pivoted at opposite sides of the carrying box so that the handle is capable of rotating above the carrying box, and the storage component inserted in the adapter slot to be electrically connected with the circuit board, wherein two sides of the carrying box are respectively provided with a positioning block, and two sides of the at least one handle are respectively provided with two positioning holes; the positioning block is fastened in the positioning hole after the at least one handle rotating at a predetermined angle above the carrying box.

9. A data storage device for server, comprising:

a tray having a carrying space;

a circuit board module disposed in the carrying space and including a circuit board, a pair of adapter slots and a connection slot; the pair of adapter slots disposed with an interval at one side of the tray; and two storage units arranged side by side in the carrying space; each storage unit including a carrying box and a storage component fixed in the carrying box; the carrying box pivoted with at least one handle, and two sides of the at least one handle pivoted at opposite sides of the carrying box so that the handle is capable of rotating above the carrying box, and the storage component inserted in the adapter slot to be electrically connected with the circuit board, wherein two sides of the carrying box are respectively provided with two stop blocks; one side of the at least one handle is blocked at a side of the stop block after the at least one handle rotating at a predetermined angle above the carrying box.

10. The data storage device for server according to claim 1, wherein the storage unit further includes an adapter connector, and the storage component is plugged into the adapter slot through the adapter connector.

11. The data storage device for server according to claim 8, wherein the bottom plate is formed a plurality of hollow parts and a plurality of hooks located correspondingly; each hook is bent and extended from a side of the hollow portion toward a direction away from the carrying space.

12. The data storage device for server according to claim 1, wherein the connection slot is disposed at a side of the circuit board in a direction perpendicular to the pair of adapter slots.

13. The data storage device for server according to claim 1, wherein there are a plurality of handles each including a first handle and a second handle; the first handle and the second handle are rotated in opposite directions above the carrying box.

14. The data storage device for server according to claim 13, wherein the first handle is located at a side of the carrying box neighboring the pair of adapter slots; the first handle is provided with a latch plate, and the carrying box has a lock plate; the first handle can be rotated away from a top of the carrying box through the latch plate disengaging from a blocking of the lock plate.

15. The data storage device for server according to claim 13, wherein the first handle and the second handle are respectively provided with at least one bump region for applying an external force thereon.

16. The data storage device for server according to claim 8, wherein the bottom plate is formed a plurality of hollow parts and a plurality of hooks located correspondingly; each hook is bent and extended from a side of the hollow portion toward a direction away from the carrying space.

17. The data storage device for server according to claim 1, wherein the connection slot is disposed at a side of the circuit board in a direction perpendicular to the pair of adapter slots.

18. The data storage device for server according to claim 1, wherein there are a plurality of handles each including a first handle and a second handle; the first handle and the second handle are rotated in opposite directions above the carrying box.

19. The data storage device for server according to claim 18, wherein the first handle is located at a side of the carrying box neighboring the pair of adapter slots; the first handle is provided with a latch plate, and the carrying box has a lock plate; the first handle can be rotated away from a top of the carrying box through the latch plate disengaging from a blocking of the lock plate.

20. The data storage device for server according to claim 18, wherein the first handle and the second handle are respectively provided with at least one bump region for applying an external force thereon.

* * * * *